(12) United States Patent
Kvarnstrand et al.

(10) Patent No.: US 11,047,894 B2
(45) Date of Patent: Jun. 29, 2021

(54) APPARATUS AND METHOD FOR PRODUCTION TESTING OF DEVICES WITH WIRELESS CAPABILITY

(71) Applicant: Blutest AB, Göteborg (SE)

(72) Inventors: John Kvarnstrand, Floda (SE);
Magnus Franzén, Kungsbacka (SE);
Eric Lundin, Gothenburg (SE)

(73) Assignee: Bluetest AB, Göteborg (SE)

( * ) Notice: Subject to any disclaimer, the term of this patent is extended or adjusted under 35 U.S.C. 154(b) by 0 days.

(21) Appl. No.: 16/958,239

(22) PCT Filed: Jan. 15, 2019

(86) PCT No.: PCT/SE2019/050024
§ 371 (c)(1),
(2) Date: Jun. 26, 2020

(87) PCT Pub. No.: WO2019/143280
PCT Pub. Date: Jul. 25, 2019

(65) Prior Publication Data
US 2020/0341044 A1  Oct. 29, 2020

(30) Foreign Application Priority Data

Jan. 17, 2018 (SE) ...................... 1850051-2
Feb. 24, 2018 (CN) .......................... 201810157507.6

(51) Int. Cl.
*G01R 1/07* (2006.01)
*G01R 29/08* (2006.01)
(Continued)

(52) U.S. Cl.
CPC ..... *G01R 29/0821* (2013.01); *G01R 29/0892* (2013.01); *G01R 29/105* (2013.01); *G01R 31/2822* (2013.01); *H04B 17/309* (2015.01)

(58) Field of Classification Search
CPC .. G01R 1/07; G01R 31/2813; G01R 31/3025; G01R 31/31905; G01R 31/31908;
(Continued)

(56) References Cited

U.S. PATENT DOCUMENTS 5,530,412 A * 6/1996 Goldblum .......... G01R 29/0821
 324/633
7,286,961 B2 * 10/2007 Kildal ................ G01R 29/0821
 702/182

(Continued)

FOREIGN PATENT DOCUMENTS

DE 102012024373 A1 6/2014
DE 102014001904 B3 4/2015
(Continued)

OTHER PUBLICATIONS

Swedish Search Report for Swedish application No. 1850051-2 filed Jan. 17, 2018, which is the parent application to the instant application, dated Aug. 20, 2018, 4 pages.

(Continued)

*Primary Examiner* — Jermele M Hollington
*Assistant Examiner* — Taqi R Nasir
(74) *Attorney, Agent, or Firm* — Harness, Dickey & Pierce, P.L.C.; Anthony G. Fussner (57) ABSTRACT

A method and apparatus for production testing of a device under test (DUT) in a chamber is disclosed, the chamber defining an internal cavity therein, adapted to enclose the DUT, and including walls having inwardly facing surfaces of an electromagnetically reflective material, thereby supporting several resonant modes within the internal cavity. The method comprises: arranging the DUT at one or several measurement position(s) in the internal cavity; measuring radio frequency transmission between the DUT and at least one chamber antenna arranged in the internal cavity sequen- (Continued)

tially in a number of different static mode distribution configurations; comparing the measured radio frequency transmission at said predetermined mode distribution configurations with reference values obtained from measurement of a reference device arranged at the same measurement position(s) within the internal cavity, and at the same static mode distribution configurations; and determining whether the DUT is acceptable or non-acceptable based on said comparing.

20 Claims, 5 Drawing Sheets

(51) Int. Cl.
*H04B 17/309* (2015.01)
*G01R 29/10* (2006.01)
*G01R 31/28* (2006.01)

(58) Field of Classification Search
CPC .......... G01R 31/31926; G01R 31/2824; G01R 29/0821; G01R 29/0892; G01R 29/105; G01R 31/2822; H04B 17/309
See application file for complete search history.

(56) References Cited

U.S. PATENT DOCUMENTS

| | | |
|---|---|---|
| 7,444,264 B2 | 10/2008 | Kildal |
| 2002/0160717 A1* | 10/2002 | Persson .............. G01R 29/0821 455/67.11 |
| 2009/0303141 A1 | 12/2009 | Kosdikian et al. |
| 2010/0203880 A1 | 8/2010 | Sotoudeh |
| 2012/0005816 A1 | 1/2012 | Wilson |
| 2012/0123723 A1 | 5/2012 | El-Hassan et al. |
| 2014/0210502 A1 | 7/2014 | Alhorr et al. |
| 2015/0149108 A1 | 5/2015 | Cozza |
| 2016/0131689 A1 | 5/2016 | Monsef |

FOREIGN PATENT DOCUMENTS

| | | |
|---|---|---|
| EP | 1223432 A1 | 7/2002 |
| WO | WO-0175460 A1 | 10/2001 |
| WO | WO-2012171562 A1 | 12/2012 |

OTHER PUBLICATIONS

International Search Report and Written Opinion for PCT Application No. PCT/SE2019/050024 which is the parent application to the instant application; dated Feb. 12, 2019, 10 pages.

* cited by examiner

APPARATUS AND METHOD FOR PRODUCTION TESTING OF DEVICES WITH WIRELESS CAPABILITY

This patent application is a U.S. national stage filing under 35 U.S.C. § 371 of PCT International Application No. PCT/SE2019/050024 filed Jan. 15, 2019 (published as WO2019/143280 on Jul. 25, 2019), which claims priority to and the benefit of Swedish Application No. 1850051-2 filed Jan. 17, 2018 and Chinese Application No. 201810157507.6 filed Feb. 24, 2018. The entire contents of these applications are incorporated herein by reference.

TECHNICAL FIELD OF THE INVENTION

The present invention relates to an improved apparatus and method for measuring the performance of a device under test (DUT) having wireless capability for production testing.

BACKGROUND

The reverberation chambers, or mode-stirred chambers, have in recent years become effective tools in testing e.g. Over-the-Air performance of various wireless communication devices. Such chambers are nowadays used frequently for measurements during e.g. product development.

The U.S. Pat. Nos. 7,444,264 and 7,286,961, by the same applicant, discloses such reverberation chambers useable to measure e.g. the radiation efficiency of antennas and the total radiated power (TRP) of mobile and wireless terminals such as cellular phones. The same measurement setups that are described in U.S. Pat. Nos. 7,444,264 and 7,286,961 were also used to determine the performance of antenna diversity. Such reverberation chambers can be used to measure transmitting performance in a fading multipath environment, and/or to measure the receive performance by a Bit-Error-Rate (BER) or a Frame-Error-Rate (FER), depending on which system the terminals are designed for.

The reverberation chamber can by making use of the above previous inventions be used for characterizing the complete performance of mobile and wireless terminals, both on transmit and receive, including transmit and receive performance of antennas, amplifiers, signal processing algorithms, and coding. The reverberation chambers presently used provides an isotropic multipath environment with a uniform distribution of angles of arrival of the incoming waves over the complete surrounding space. This is a good reference environment for antennas and wireless terminals in multipath with fading.

Reverberation chambers provide a straightforward solution to testing of devices that rely on multipath signal propagation for communication, often known as MIMO (Multiple Input Multiple Output Technologies) and for devices that simultaneously operate using several frequency bands.

In the reverberation chamber the signal is injected into a closed cavity with an antenna. The cavity is composed of reflective walls. The signal arrives at the device under test after multiple reflections through many different trajectories. This creates a faded signal at the receiver. By moving mode stirring plates and/or the turntable the geometry of the chamber changes, which in turn changes the fading that the signal experiences. A large number of fading states with different incident wave composition can thereby be created and tested.

However, use of conventional reverberation chambers for production testing has so far not been successful. In the production of electronic devices such as mobile telephones, laptops, tablet computers, and the like, very large volumes are produced, and there is a need to production test each product, to ensure that each device functions properly, and meets the quality standards defined by the manufacturer. Even though such measurements could be made in a conventional reverberation chamber, each measurement in such a chamber is cumbersome and time-consuming, which would significantly add to the overall production time and cost for the products.

US 2002/0160717 discloses an attempt to solve this, by using a reverberation chamber into which products to be tested are continuously transported into and out from the chamber by a conveyor, and where several devices are tested simultaneously. However, despite this, the testing procedure is still cumbersome, time-consuming and costly.

In current production test a device under test is instead placed in a shielded box. The shielded box is typically inwardly covered with RF absorbing materials on the inside, to make it more or less anechoic, and an antenna coupler is used to make an over-the-air connection to the device under test. However, even though this method is rather fast and cost-efficient, the uncertainty of the test is high due to high sensitivity to the geometrical arrangement inside the shielded box and typically only a single sample of the link is acquired. Consequently, there is a relatively high probability that non-acceptable products, not meeting the defined quality standards, are approved, and that acceptable products, meeting the defined quality standards, are not approved.

Thus, there is still a need for an improved method and apparatus for production testing of devices, such as mobile phones, laptops, tablets and the like, where adequate testing is provided, and which can be operated in a cost- and time-efficient manner.

SUMMARY OF THE INVENTION

It is therefore an object of the present invention to provide a method and an apparatus which alleviates all or at least some of the above-discussed drawbacks of the presently known systems.

This object is achieved by means of an apparatus and a method as defined in the appended claims.

According to a first aspect of the present invention, there is provided a method for product testing of a device under test (DUT) in a chamber, the chamber defining an internal cavity therein, adapted to enclose the DUT, and including walls having inwardly facing surfaces of an electromagnetically reflective material, thereby supporting several resonant modes within the internal cavity, the method comprising:

arranging the DUT at one or several measurement position(s) in the internal cavity;

measuring radio frequency transmission between the DUT and at least one chamber antenna arranged in the internal cavity sequentially in a number of different static mode distribution configurations;

comparing the measured radio frequency transmission at said predetermined mode distribution configurations with reference values obtained from measurement of a reference device arranged at the same measurement position(s) within the internal cavity, and at the same static mode distribution configurations; and determining whether the DUT is acceptable or non-acceptable based on said comparing.

The present invention provides a chamber essentially function as a reverberation chamber, but not necessarily providing an isotropic environment.

The present invention is based on the realization that production testing poses specific challenges, and is very different from conventional measurements. For production testing it is of little importance to know the absolute values of specific parameters, such as radiated power and receiver sensitivity, but it is important to distinguish between a nominally and correctly working device, meeting the predefined quality standards, and an anomalous and faulty device, not satisfying the quality standards. The new invention allows a reverberation chamber to be used that is significantly smaller than a traditional reverberation chamber, while providing capability to detect if the device under test is faulty or performing poorly. Specifically, it is possible to determine if the radio module, is anomalous, such as giving a deviation in output power or receiver sensitivity, or if the antenna module is anomalous, providing an erroneous antenna pattern.

Due to the difference in the static mode distribution configuration for each measurement, the coupling between the DUT and the chamber antenna(s) and the thereto connected measurement instrument will be different in each of these measurements. Thus, the measurements provide values related to a variety of different states.

Further, these measurements are compared to reference values, provided by measuring on a reference device in the same position(s) and with the same static mode distribution configurations. The reference device may be a product that has been measured previously and which has been determined to fulfill the quality standard. Thus, the reference device has a known performance, which has been determined to fulfill the specified requirements. The reference device may be referred to as a "golden standard" or "golden device". The reference measurements can be made before measuring on every DUT, or after measurement of the DUT. It is also possible, and normally preferred, to measure on the reference device and to store the measured values, so that measured values of many DUTs can be compared to one and the same reference measurements. Thus, following initialization measurement on the reference device, when starting measuring on a new type of product, a plurality of DUTs may be measured and compared to the golden device. If necessary, the measurement on the golden device can be repeated at certain times, such as periodically, to calibrate the system and ensure that the setup is stable.

It is also possible to measure on the golden device in more positions and mode distribution states than necessary to provide the determination whether the product under test meets the standard or not. This can e.g. be used to enable measurement on several DUTs simultaneously.

A comparison is made between the measurement values for the DUT, and the corresponding measurement values for the golden standard. The differences may be analyzed to determine whether the tested DUT is acceptable or not. For example, the differences for each measurement may be considered against a threshold indicating a maximal permitted deviation. Additionally, or alternatively, it is possible to consider a pattern or trend occurring over several or all of the measurement points. From the characteristic sequence of samples it can e.g. be determined if the device has a faulty antenna, in which case there will be low correlation to the golden device. In this case, the tendency of the values for the DUT measurements and the measurements on the golden device to change together is relatively low. Alternatively, if the radio is faulty, the sequence will be same as for the golden device, but with an offset. In this case, the measurement values of the DUT and the golden device may be unchanged in correlation, but the magnitude of displacement is relatively high.

The present invention enables production test of devices in production with higher reliability in pass/fail determination than previously known solutions. It can also distinguish between failures that cause the device to have an anomalous antenna pattern and failures that give a nominal antenna pattern but gives an anomalous output power or receiver sensitivity. Further, the new production testing is relatively easy and cost-efficient to implement, and can be operated in a fast and cost-efficient way.

The term "device under test" is in the context of this application used to indicate any type of device capable of transmitting and/or receiving electromagnetic signals through a wireless interface. In particular, the device under test can be antennas, mobile phones, tablets and other wireless terminals.

According to one embodiment, the step of comparing the measured radio frequency transmission at said predetermined mode distribution configurations with reference values obtained from measurement of a reference device arranged at the same measurement position(s) within the internal cavity, and at the same predetermined static mode distribution configurations, comprises determination of at least one of correlation and offset between the measurements for the DUT and the reference device.

The chamber for testing in accordance with the present invention can be made much smaller than conventional reverberation chambers, since there is no need to provide an isotropic and uniform field distribution. On the contrary, since the DUT is measured at specific positions, and at specific static mode distribution configurations, and for each measurement compared with a reference device measured under exactly the same conditions, it is in fact an advantage that the conditions for each measurement differ. Thus, in a preferred embodiment, at least one, and preferably all, of the width, length and height of the chamber are less than 1 meter, and preferably less than 75 cm, and most preferably less than 50 cm. For example, the chamber can be made small enough to fit in a standard 19-inch rack, i.e. a standardized frame or enclosure for mounting electronic equipment modules, arranged to receive modules where the front module has a width of 19 inches (48.3 cm).

The different static mode distribution configuration may be provided in various ways. For example, the chamber may comprise at least one moveable mode-stirrer, wherein different static mode distribution configurations can be obtained by moving the mode-stirrer into different positions. The moveable mode-stirrer may e.g. be a rotatable mode-stirrer, comprising plates of reflective material, rotatably arranged on a rotatable shaft or the like. However, the moveable mode-stirrer may also comprise plates moveable in a linear direction, and other types of movement.

Additionally, or alternatively, the chamber may comprise two or more chamber antennas, wherein different static mode distribution configurations are obtained by using different chamber antennas. Thus, by using a plurality of chamber antennas, different mode distribution configurations may be obtained by operating the chamber antennas in a specific order.

Additionally, or alternatively, the chamber may also comprise a moveable DUT holder, thereby defining a plurality of measurement positions, wherein different static mode distribution configurations are obtained by using different measurement positions. For example, the DUT(s) may be arranged on a rotatable turntable.

The number of predetermined static mode distribution configurations measured in sequence may be any number providing an adequate reliability of the measurement. In a preferred embodiment, this number is at least 5, and preferably at least 10, and most preferably at least 15. Further, the number of predetermined static mode distribution configurations measured in sequence is preferably kept relatively low, thereby increasing the speed and cost-effectiveness of the process. Preferably, this number is less than 100, and preferably less than 75, and most preferably less than 50.

In one embodiment, the measuring of radio frequency transmission between the DUT and at least one chamber antenna comprises at least one of measuring radiated power in radio frequency transmission from the DUT to the chamber antenna(s), and measuring receiver sensitivity in radio frequency transmission from the chamber antenna(s) to the DUT. Receiver sensitivity is a measure of how well the receiver performs and is defined as the power of the weakest signal the receiver can demodulate with a certain threshold bit error rate. Radiated power is a measure of how much power is radiated by an antenna when the antenna is connected to an actual radio (or transmitter).

In one embodiment, the DUT is connected to a controller of the chamber via a wireless interface, and preferably via an acoustic interface. The interface may be used for sending instructions to the DUT from the controller regarding e.g. when and how to transmit, for sending measurement data from the DUT to the controller, etc. The interface may be via a USB cable connection. However, connecting the DUT to the USB interface takes time, and the connection may also be worn and degraded over time, thereby possibly resulting in malfunction and measurement errors. Thus, for production tests, where very many products are tested during a relatively short time, a wireless interface is preferred. The wireless interface may e.g. use radio frequency communication, such as Bluetooth or Wifi. However, most preferably the wireless interface uses frequencies and/or communication technologies which are very different from the radio frequency communication to be measured, thereby avoiding that the measurements are affected by the control communication. For example, the wireless interface may be an acoustic interface, where communication may use sound for data communication. For such an interface, a speaker and a microphone may be provided in the chamber, for communication with speakers and microphones on the DUTs (which are often already available). To enable communication via the acoustic link, a software program can be installed on the DUT such that it can listen and speak, decode and encode data for acoustic transmission, and perform the necessary control of the DUT for the test. The new production testing can also be arranged to production test two or more DUTs simultaneously. It is for example possible to arrange several DUTs in the test chamber at various measurement positions, all of which have been measured also with the reference device. In particular, it is possible to arrange 2, 3, 4 or more DUTs on a common turntable, and to rotate the turntable between measurements so that at least some DUTs are measured at the same measurement positions. In one embodiment, the turntable is rotated between measurements so that all DUT are measured in all the positions where the DUTs are initially positioned. When testing transmission from the DUTs to the chamber antenna(s), the DUTs may transmit simultaneously at different frequencies, so that all the DUTs can be measured simultaneously. By letting the DUTs transmit at different frequencies, it is possible for the base station emulator to separate them. In receive test several DUTs can simultaneously listen to the same transmission from the base station emulator.

The chamber has walls of an inwardly reflecting material, such as metal, reflecting incident electromagnetic radiation. The term "walls", is, in the context of the present application and the herein disclosed chamber, used to describe walls in any orientation, i.e. including sidewalls, ceiling and floor. However, all the walls are not necessarily reflecting. Further, the chamber may be fitted with one or several absorber(s) to reduce delay spread and increase coherence bandwidth. The optional absorber(s) may be arranged as stand-alone objects arranged within the chamber, such as in the form of a cylinder, a shield, a cube, a cone, a pyramid or the like. However, the absorber(s) may also, in addition or as an alternative, be provided on the walls of the chamber, thereby at least partly covering the inwardly facing surfaces of the walls.

According to another aspect of the present invention, there is provided a test apparatus for production testing of a device under test (DUT), said apparatus comprising:

a chamber, the chamber defining an internal cavity therein, adapted to enclose the DUT when arranged at one or several measurement position(s), and including walls having inwardly facing surfaces of an electromagnetically reflective material, thereby supporting several resonant modes within the internal cavity;

at least one chamber antenna arranged within the internal cavity;

a measuring instrument connected to the DUT and the chamber antenna(s), for measuring the transmission between said DUT and the chamber antenna(s); and a controller, wherein the controller is arranged to measure, with said measuring instrument, radio frequency transmission between the DUT and at least one chamber antenna arranged in the internal cavity sequentially in a number of different static mode distribution configurations, to compare the measured radio frequency transmission at said predetermined mode distribution configurations with reference values obtained from measurement of a reference device arranged at the same measurement position(s) within the internal cavity, and at the same static mode distribution configurations, and to determine whether the DUT is acceptable or non-acceptable based on said comparison.

With this aspect of the invention, similar advantages and preferred features are present as in the previously discussed first aspect of the invention.

In order to provide different static mode distribution configurations, the test apparatus may further comprise at least one, and preferably two or more of:

One or more mechanically moveable mode-stirrer;

Two or more independently operable chamber antennas; and

A moveable DUT holder, such as a turntable.

The test apparatus may further comprise a speaker and a microphone, thereby providing an acoustic interface between the DUT and the controller.

Also, the test apparatus may comprise an absorber arranged within the internal cavity of the chamber.

These and other features and advantages of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well-known constructions or functions are not described in detail, so as not to obscure the present invention.

Figure 1:
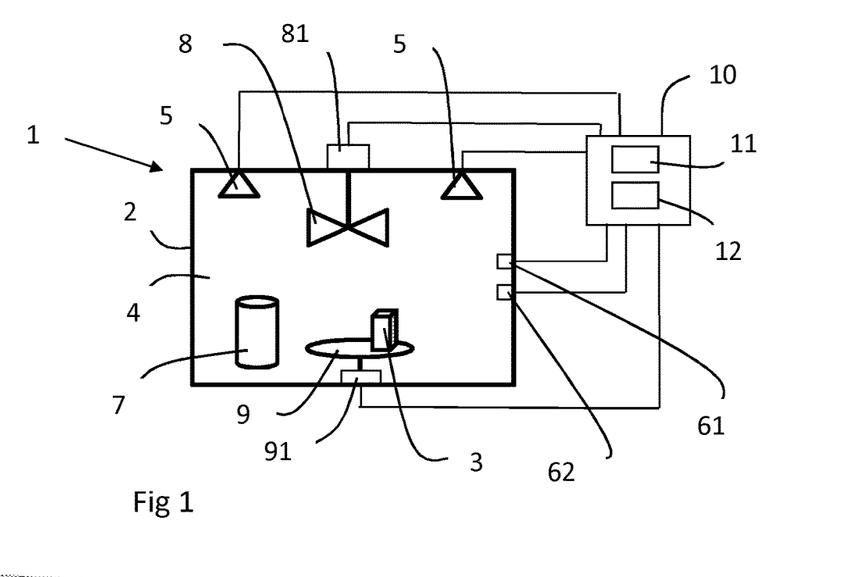
FIG. 1 is a schematic view of a test apparatus in accordance with an embodiment of the invention.

FIG. 1 shows an embodiment of a test apparatus 1 for production testing of a device under test (DUT) 3, such as antennas, mobile or wireless terminals, and specifically for antennas and terminals intended to be used in a multipath environment. The measurement arrangement comprises a chamber 2. The chamber 2 defines/forms an internal cavity 4 and is arranged to enclose the DUT 3 within a set of walls, at least some of having inwardly facing surfaces of an electromagnetically reflective material in order to simulate a multi-path environment. The walls can e.g. be provided with metallic foil or metallic plates on their inner surfaces.

The chamber 2 can have any size and shape. However, preferably, the chamber 2 is of a rectangular or cubic shape and dimensioned to be portable. For example, the chamber 2 can be arranged to define/form an internal cavity 4 with a space of 0.1 m³ to 1 m³. In particular, it is preferred that the width of the chamber is about 19 inch (48.3 cm) to fit in a standard 19-inch rack. Other shapes, which are easy to realize, are vertical walls with flat floor and ceiling and with a horizontal cross-section that forms a circle, ellipse or polygon.

Further, there is provided at least one, and preferably several, chamber antenna(s) 5 arranged in the cavity 4. The first chamber antenna(s) 5 could comprise a horn antenna, an electric monopole antenna, a helical antenna, a microstrip antenna, an electric monopole antenna or similar.

The chamber antenna(s) 5 is connected to a control system 10, comprising a measuring instrument 11 and a controller 12.

A direct line-of-sight may be present between the chamber antenna(s) and the DUT, but it is also feasible to provide a shield or the like (not shown) to prevent a direct line-of-sight.

During measurement, the measuring instrument 10 is connected to the DUT 3, and the chamber antenna(s) 5 in order to measure the transmission between the chamber antenna(s) 5 and the DUT 3 such that the performance of the DUT 3 can be measured and eventually characterized. The measuring instrument 10 may be a network analyzer or spectrum analyzer. The measurement arrangement 1 may further include analyzing means, for example integrated in the controller 12. The controller may e.g. be a computing device, such as a laptop or PC, which is connected to the measuring instrument 10. The control system, including the controller and the measuring instrument, may be arranged within a single unit, as an centralized, integrated control, but may also be arranged in several separate units connected to each other, as a distributed system.

Further, the test apparatus 1 may comprise one or several absorber(s) 7, arranged on an inner surface of the sidewalls, or as a stand-alone component.

In the cavity 4 formed by the chamber 2, at least one moveable object can be provided, functioning as a mode-stirrer 8. Such moveable objects that are used to obtain a mode distribution in the chamber 2 are per se well known in the art, and described e.g. in WO2012/171562, by the same applicant, said document hereby being incorporated by reference, and may take various forms. For example, the moveable object may comprise an object which is rotatable around an axis of rotation, as illustrated in FIG. 1. Another possibility is to use elongated objects, such as plates, being displaceable by means of e.g. screws, which is rotated around by a driving means, such as a servo motor or a step motor, and a nut on this screw to which the elongate narrow object is fastened. It is however possible to use other means for displacing the elongate object. The long narrow object may have the form of a metal sheet, but it can also have many other forms, e.g. it is advantageous to give it an irregular form. A motor 81 may be provided to move the mode stirrer 8, and may be connected to the control system 10. By moving the mode-stirrer, different mode distribution configurations occur within the chamber.

The test apparatus may additionally or alternatively comprise a moveable holder 9 for the DUT, such as a rotatable platform or a turntable, on which the DUT 3 is positioned during measurement. The moveable holder may also be operated by a motor 91, which may be connected to the control system. By moving the moveable holder 9, the mode distribution within the chamber will change, and further, if the mode distribution within the chamber is non-homogeneous, the mode distribution experienced by the DUT will change due to movement of the DUT to another position.

When using at least two moving objects, they could be moved simultaneously or sequentially.

The moveable object(s) may functionally be referred to as field stirrer(s) or mode stirrer(s), and are preferably operable to be moved by rotation, translation, pivoting, etc. continuously across the length and/or width of the chamber. In this manner, continuous variation in the internal structure of the chamber is provided. The variation causes multiple changing reflections of electromagnetic waves within the chamber as the field stirrer scans. These changing reflected waves interfere with one another differently and form modes with varying excitations.

The mode distribution within the chamber can also be changed by controlled operation of the chamber antennas, such as using only one of the chamber antennas at a time, or by using various combinations of chamber antennas.

Further, a video camera (not shown) may be arranged inside the cavity. The video camera is able to forward video information from the interior of the chamber to the exterior of the chamber during testing. The video information may be forwarded to the control system, and the video information may be correlated to the measurement data.

Further there is preferably provided a display arranged outside the cavity able to reproduce the video information received from the video camera. For example, the display may be mounted on an external wall of the chamber, and/or on a stand-alone measurement instrument 11 or controller 12 such as a PC.

More general details and examples in relation to the measurement chamber and how it may be operated are available from U.S. Pat. Nos. 7,444,264 and 7,286,961, both said patents hereby being incorporated in their entirety by reference.

During testing the DUT may need a communication link in order to be controlled to set it in appropriate test mode, to switch between radio channels to be tested, to report what power level it receives and other tasks. The communication between the DUT and the control system may be provided via a cable, e.g. connected by a USB interface. However, preferably the communication is provided via a wireless link, and e.g. through an acoustic link. To this end, a microphone 61 and a speaker 62 may be provided within the cavity, for receiving sound signals from the DUT, and for sending out sound signals to be received by the DUT, respectively. Both the control system and the DUTs are preferably provided with a software program for decoding and encoding data for acoustic transmission, and to perform the necessary control of the DUT for the test based on such data.

Figure 2:
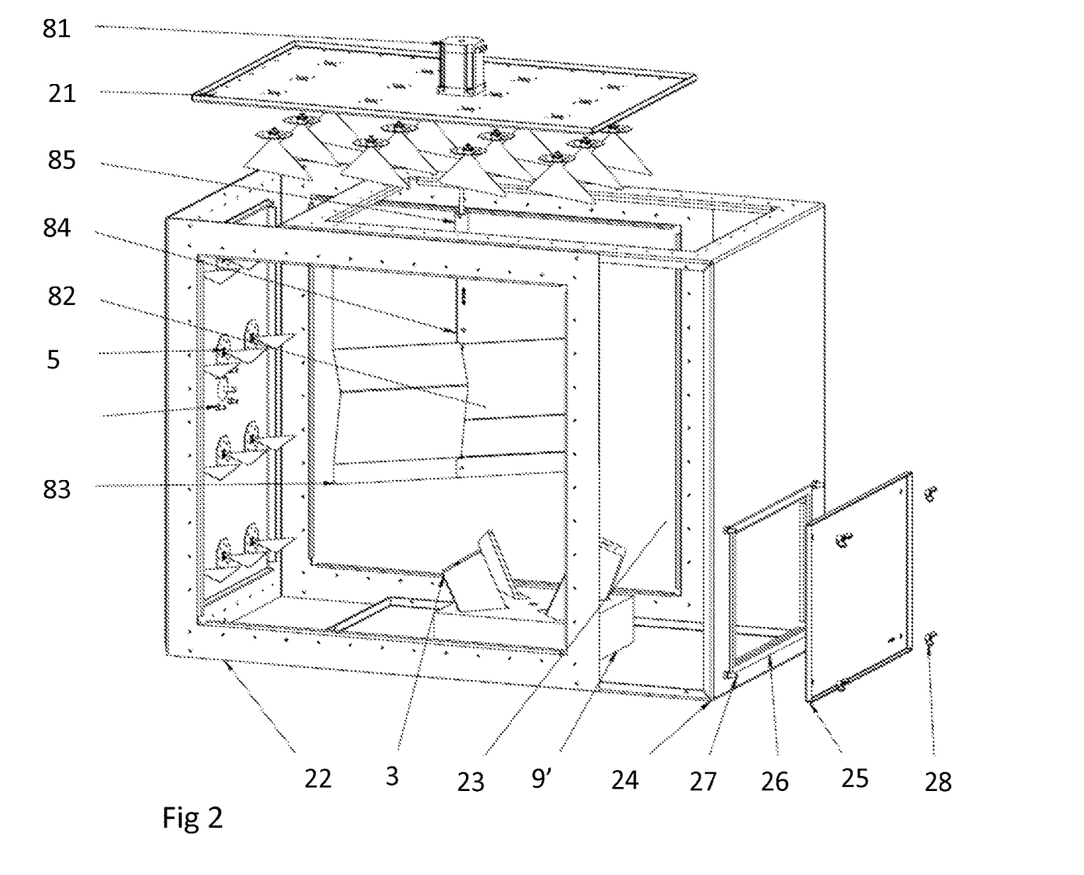
FIG. 2 is a perspective view, partly exploded, showing an embodiment of a measurement chamber in more detail.

In FIG. 2, another embodiment of a chamber is shown in greater detail. The chamber is here formed of a chamber rear frame part 22 and a chamber front frame part 24. These parts form the frame of the chamber. The frame parts further include sidewalls at the front and at the back. Side lids 23 (only one shown) are connected to the frame and covers the sides extending between the front and back. Further, rear and top lids 21 are also connected to the frame, and provided to cover the top and bottom of the chamber. An access opening is provided in the front side. In the illustrative example, the access opening is covered by a removable door 25. The door is here connected to the front by means of screws 27 and bolts 28. An EMI gasket 26 may further be arranged around the rim of the opening.

Instead of using a removable door, it is also possible to use a hinged door, which can be pivoted for opening and closing. It is also possible to omit the door, and e.g. providing openings in the form of waveguides to shield the against radiation to the outside. Such a waveguide opening arrangement may e.g. be of the type disclosed in US 2002/0160717, said document hereby being incorporated in its entirety by reference.

In the illustrative example of FIG. 2, the DUTs to be measured are arranged on static, non-rotatable DUT holder 9'. This DUT holder may e.g. be in the form of a fixture with recesses to receive the DUTs 3, and is preferably made of a low dielectric material. However, as discussed above, it is also possible to use a rotatable DUT holder, such as a turntable. Still further, it is possible to use a conveyor or the like, for automated insertion and removal of DUTs into the measurement chamber. Such an automated procedure may e.g. work in the same way as disclosed in US 2002/0160717.

Figure 3:
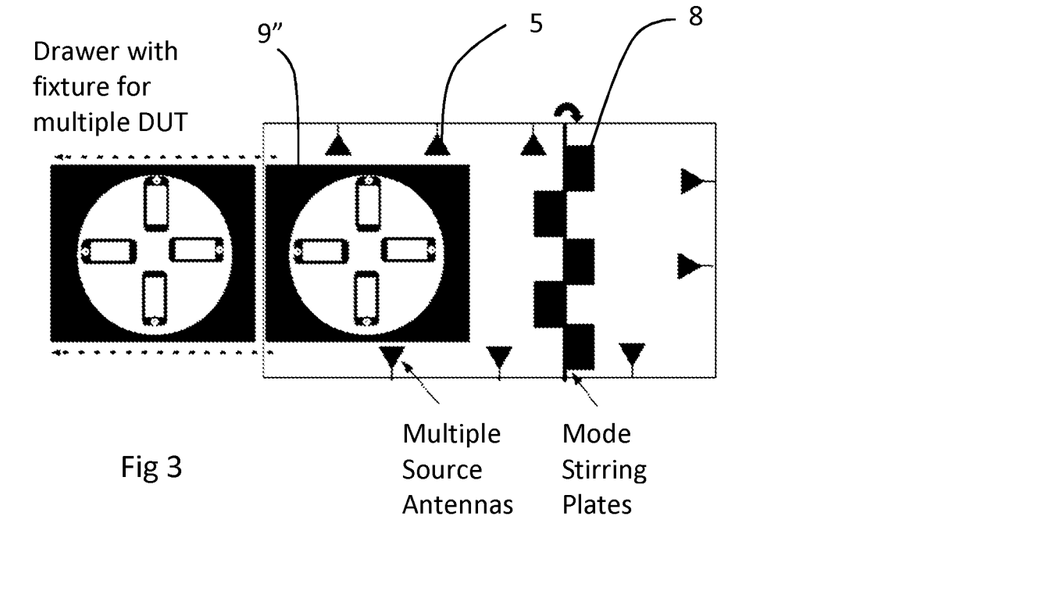
FIG. 3 is a schematic view from above of another embodiment of the measurement chamber.

As a further alternative, it is possible to provide the DUT holder in a drawer, as illustrated in FIG. 3. Here, the drawer may be pulled out from the measurement chamber for placement of the DUT(s) in the designated positions in the DUT holder, and then push the drawer back into the measurement chamber for measurement and testing. The drawer may in this embodiment comprise a DUT holder 9'' arranged to accommodate one or more DUTs.

It is also possible to measure on several DUTs simultaneously. To this end, the DUT holder may be arranged to hold several DUTs simultaneously. The DUTs may then be maintained stationary during the entire test procedure, and measured at the same measurement position the whole time, but with the DUTs at different measurement positions. It is however also possible to move the DUTs between measurements, and to measure each DUT in two or more different measurement positions.

In the illustrative example of FIG. 2, a plurality of chamber antennas 5 are provided, both on the back wall and on the top lid. In this example, 9 antennas are provided on the back wall, and 9 antennas in the ceiling. However, this is merely an example, and any number of antennas may be used.

Further, the chamber of FIG. 2 comprises a rotatable mode-stirrer. The mode stirrer here comprises two mode-stirring plates 82, 83, which are connected together, and which are attached to a shaft 84 forming an axis for rotation of the mode stirrer. The shaft is connected to a motor 81, such as a stepper motor, arranged on top of the top lid 21, via an axle coupling 85.

Figure 6:
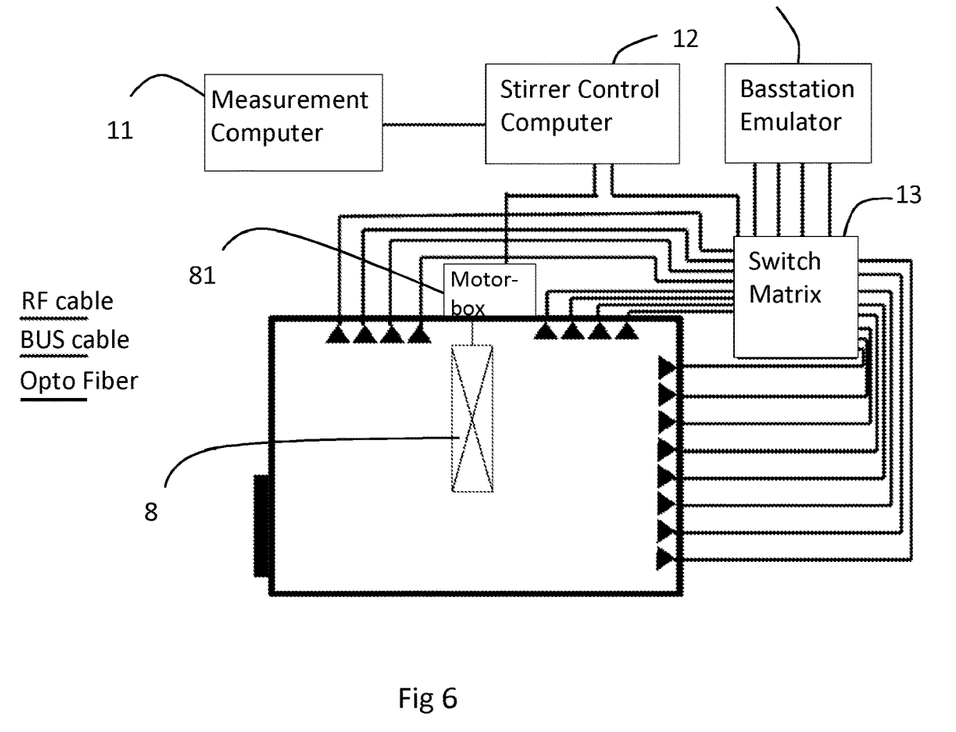
FIG. 6 is a schematic view of another embodiment of the measurement apparatus.

FIG. 6 illustrates a further example of an embodiment of the test apparatus, here illustrating the control system in further detail. The control system here comprises a measurement instrument 11 in the form of a measurement computer, and a controller 12 in the form of a stirrer control computer. The measurement computer and the stirrer control computer are connected to each other, e.g. via an optical fiber. The stirrer control computer is further connected to a motor box comprising the motor 81 for moving the mode-stirrer 8. The stirrer control computer may further be connected to a switch matrix 13. The switch matrix is further connected to a base station emulator 14.

Figure 4A:
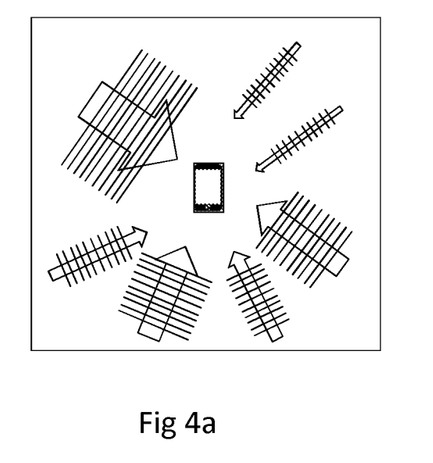
FIG. 4a-b are schematic view illustrating different static mode distribution configurations.
Figure 4B:
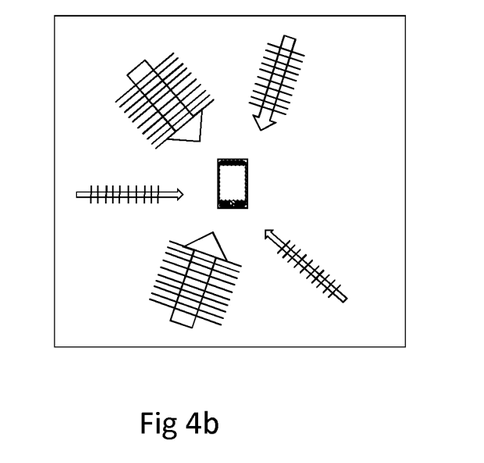

By changing the position of the mode stirrer, the measurement position of the DUT, and/or the operation of the chamber antennas, e.g. by exciting the cavity with different chamber antennas or different combinations of chamber antennas, the mode distribution configuration within the chamber changes. This is illustrated schematically in FIGS. 4a and 4b, where FIG. 4a illustrates measurement of a DUT at one measurement position at a first mode distribution configuration, and FIG. 4b illustrate measurement of the same DUT at the same position, but with a second, different mode distribution configuration. The coupling between the DUT and the test instrument will be different in each of these states.

Figure 7:
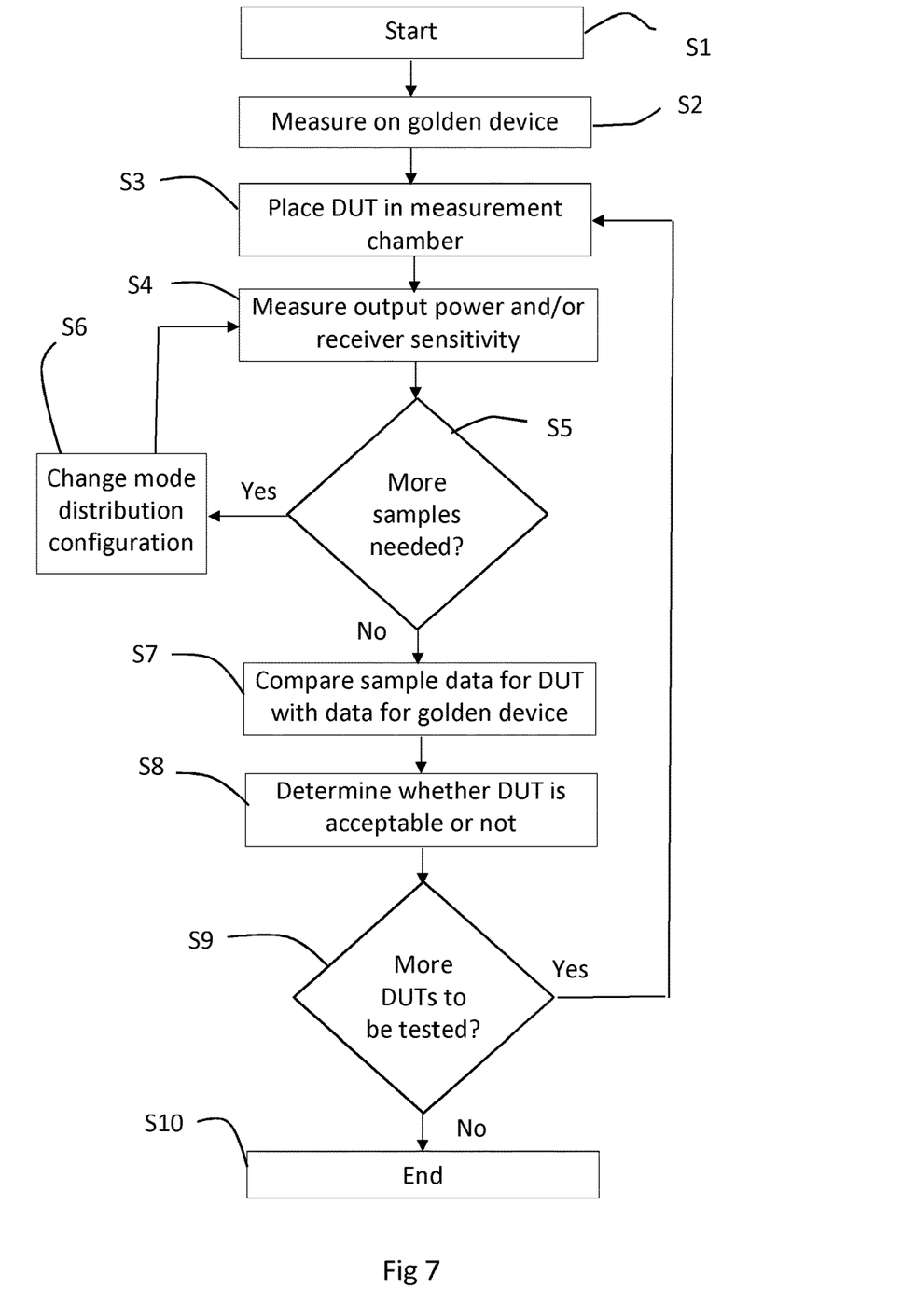
FIG. 7 is a schematic flow-chart representation of a method for production testing of a device under test according to an embodiment of the present invention.

In FIG. 7 a schematic flow-chart representation of a method for production testing of a device under test according to an embodiment of the present invention is illustrated. The method includes as step S1 measuring of a reference DUT, a golden device, which has previously been approved and found to meet a defined quality standard. The reference DUT is measured in a plurality of different static mode distribution configurations, and possibly also in a number of different measurement positions. The measurement data for each mode distribution configuration is stored, together with information about the exact circumstances for each measurement, such as the positioning of the mode stirrers, the measurement position for the device, the operation of the chamber antennas, etc.

Thereafter, in step S2, a DUT is arranged in the measurement chamber in a measurement position in which the golden device has been measured. Output power and/or receiver sensitivity is then measured for the DUT in this position and with this mode distribution configuration, step S4. It is thereafter determined whether further measurement samples are needed, step S5. This may e.g. be determined by a counter, to be compared to a predetermined number of samples to be obtained. The number of samples required may e.g. be in the range of 16-48. If more samples are needed, the mode distribution configuration is then changed, by e.g. moving the DUT, moving a mode-stirrer, changing the operation of the chamber antennas or the like, step S6, and the method returns to step S4 for continued measurement.

Hereby, a series of samples of signals will be measured with a different mode configuration in each sample. Each mode configuration will represent a different scenario of incident wave fronts on the device under test.

When no further samples are required, the process proceeds to step S7, where the measured data for each sample is compared to the reference data obtained when measuring the golden device. Here, each measurement data is compared with the reference data obtained when measuring the golden device during the exact same circumstances, i.e. with the same mode distribution configuration and at the same measurement position.

Based on this comparison, it is then determined whether the DUT is acceptable, i.e. a pass, or not, i.e. a fail. This can e.g. be determined by determining an acceptable maximal deviation from the golden device at every measurement sample or the like. However, preferably the determination is made by looking at the offset and/or correlation between a plot of the measurement data for the samples for the DUT and a plot for the corresponding measurement data for the golden device. Thresholds may be determined in respect of either or both of the offset and the correlation to be used in determining whether the tested DUT is acceptable or not.

Figure 5A:
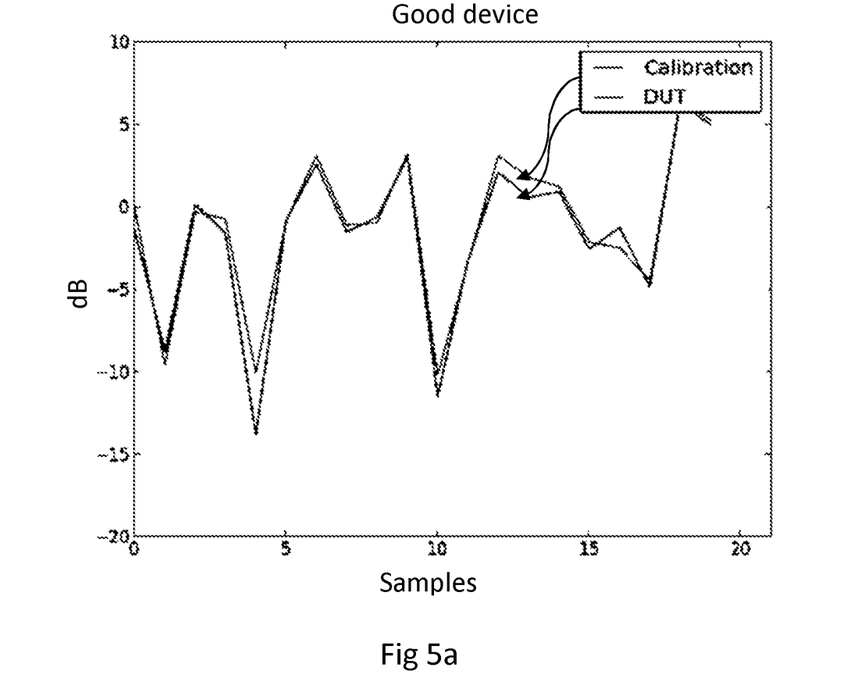
FIG. 5a-c are diagrams showing measured DUT samples together with measured reference samples.
Figure 5B:
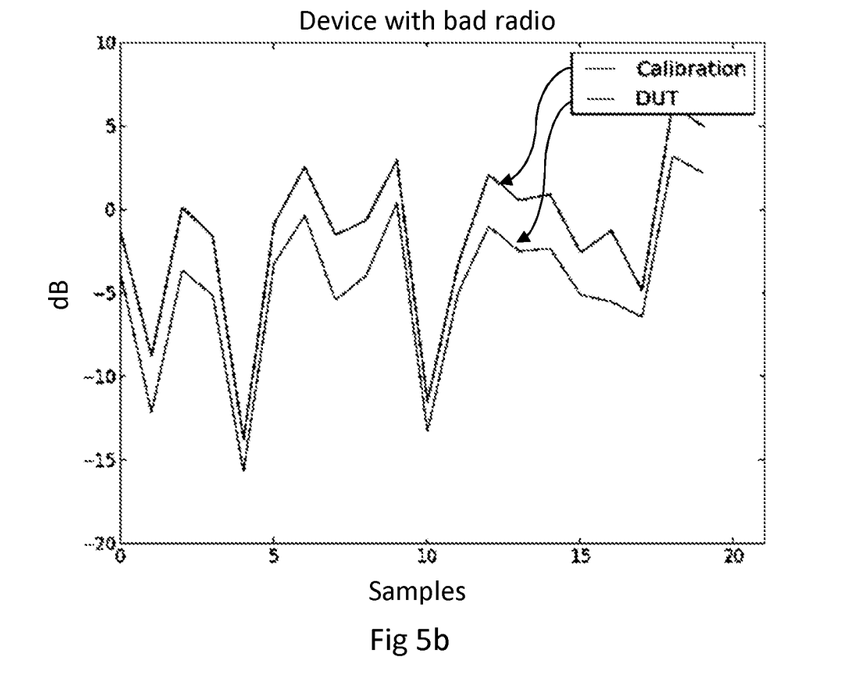
Figure 5C:
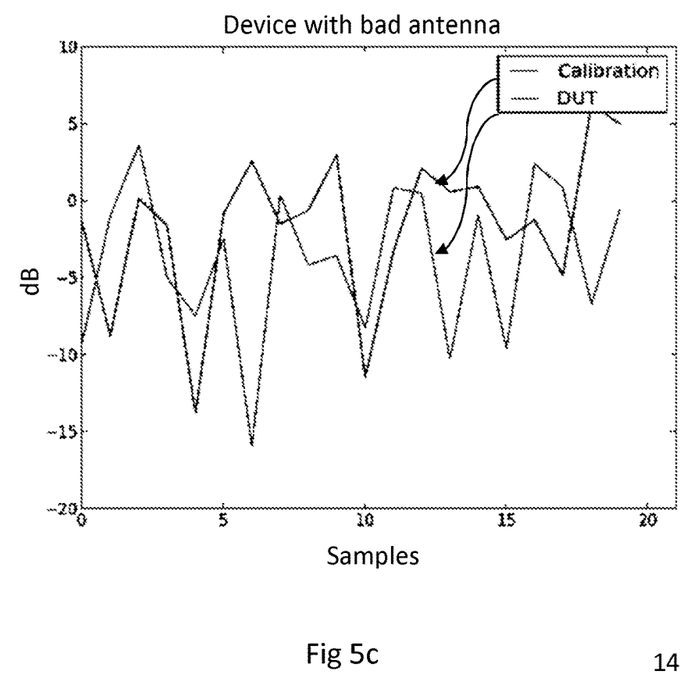

Examples of differences in offset and correlation are illustrated in FIGS. 5a-5c. FIGS. 5a-5c shows the measured transmitted power (dB) in relation each sample, numbered 1, 2, etc. One curve shows the measurement values for the measured DUT, and one curve shows the calibration measurement values obtained from measuring the golden device.

In FIG. 5a, there is a strong correlation between the calibration measurements and the DUT measurement, and no offset between the curves. This shows that the tested DUT is good, and meets the defined quality standards.

In FIG. 5b, there is also a strong correlation between the curves, but the curves are offset from each other. This is an indication that the radio of the tested DUT is faulty, and the tested DUT fails to meet the defined quality standard.

In FIG. 5c, there is a low correlation between the curves, indicating that the tested DUT has a faulty antenna. Also in this case, the tested DUT fails to meet the define quality standard.

Returning to the process of FIG. 7, it is then determined whether more DUTs should be tested, step S9, and if so, the process returns to step S3, and a new DUT is arranged within the measurement chamber.

If many DUTs are to be tested, it may be necessary to calibrate the system occasionally, by restarting the process from the beginning, step S2, and again measure on the golden device. Thus, the process may be restarted, and the golden device measured again, at regular intervals to ensure that the setup is stable.

The invention has now been described with reference to specific embodiments. However, several variations of the test apparatus and method are feasible. For example, the various features discussed in the foregoing may be combined in various ways. Such and other obvious modifications must be considered to be within the scope of the present invention, as it is defined by the appended claims. It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting to the claim. The word "comprising" does not exclude the presence of other elements or steps than those listed in the claim. The word "a" or "an" preceding an element does not exclude the presence of a plurality of such elements. Further, a single unit may perform the functions of several means recited in the claims.

The invention claimed is:

1. A method for production testing of a device under test (DUT) in a chamber, the chamber defining an internal cavity therein, adapted to enclose the DUT, and including walls having inwardly facing surfaces of an electromagnetically reflective material, thereby supporting several resonant modes within the internal cavity, the method comprising:
    arranging the DUT at one or several measurement position(s) in the internal cavity;
    measuring radio frequency transmission between the DUT and at least one chamber antenna arranged in the internal cavity sequentially in a number of different static mode distribution configurations;
    comparing the measured radio frequency transmission at said predetermined mode distribution configurations with reference values obtained from measurement of a reference device arranged at the same measurement position(s) within the internal cavity, and at the same static mode distribution configurations; and
    determining whether the DUT is acceptable or non-acceptable based on said comparing.

2. The method of claim 1, wherein the chamber comprises at least one moveable mode-stirrer, and wherein different static mode distribution configurations are obtained by moving the mode-stirrer into different positions.

3. The method of claim 1, wherein the chamber comprises two or more chamber antennas, and wherein different static mode distribution configurations are obtained by using different chamber antennas.

4. The method of claim 1, wherein the chamber comprises a moveable DUT holder, thereby defining a plurality of measurement positions, and wherein different static mode distribution configurations are obtained by using different measurement positions.

5. The method of claim 1, wherein the number of predetermined static mode distribution configurations measured in sequence is at least 5.

6. The method of claim 1, wherein the number of predetermined static mode distribution configurations measured in sequence is less than 100.

7. The method of claim 1, wherein the measuring of radio frequency transmission between the DUT and at least one chamber antenna comprises at least one of measuring radiated power in radio frequency transmission from the DUT to the chamber antenna(s), and measuring receiver sensitivity in radio frequency transmission from the chamber antenna(s) to the DUT.

8. The method of claim 1, wherein the step of comparing the measured radio frequency transmission at said predetermined mode distribution configurations with reference values obtained from measurement of a reference device arranged at the same measurement position(s) within the internal cavity, and at the same predetermined static mode distribution configurations, comprises determination of at least one of correlation and offset between the measurements for the DUT and the reference device.

9. The method of claim 1, wherein the DUT is connected to a controller of the chamber via a wireless interface.

10. The method of claim 1, wherein the method is arranged to production test two or more DUTs simultaneously.

11. The method of claim 10, wherein when testing transmission from the DUTs to the chamber antenna(s), the DUTs transmit simultaneously at different frequencies.

12. A test apparatus for production testing of a device under test (DUT), said apparatus comprising:
- a chamber, the chamber defining an internal cavity therein, adapted to enclose the DUT when arranged at one or several measurement position(s), and including walls having inwardly facing surfaces of an electromagnetically reflective material, thereby supporting several resonant modes within the internal cavity;
- at least one chamber antenna arranged within the internal cavity;
- a measuring instrument connected to the DUT and the chamber antenna(s), for measuring the transmission between said DUT and the chamber antenna(s); and
- a controller, wherein the controller is arranged to measure, with said measuring instrument, radio frequency transmission between the DUT and at least one chamber antenna arranged in the internal cavity sequentially in a number of different static mode distribution configurations, to compare the measured radio frequency transmission at said predetermined mode distribution configurations with reference values obtained from measurement of a reference device arranged at the same measurement position(s) within the internal cavity, and at the same static mode distribution configurations, and to determine whether the DUT is acceptable or non-acceptable based on said comparison.

13. The test apparatus of claim 12, wherein the chamber has a width, length and height, at least one or more of which is less than 1 meter.

14. The test apparatus of claim 12, further comprising a mode stirrer to provide said static mode distribution configurations.

15. The test apparatus of any one of the claim 12, further comprising a speaker and a microphone, thereby providing an acoustic interface between the DUT and the controller.

16. The test apparatus of any one of the claim 12, further comprising an absorber arranged within the internal cavity of the chamber.

17. The method of claim 1, wherein the DUT is connected to a controller of the chamber via an acoustic interface.

18. The test apparatus of claim 12, wherein the chamber has a width, length and height, at least one or more of which is less than 75 centimeters.

19. The test apparatus of claim 12, wherein the chamber has a width, length and height, at least one or more of which is less than 50 centimeters.

20. The test apparatus of claim 12, wherein the chamber has a width, length and height each of which is less than 1 meter.

* * * * *